United States Patent [19]
Crook et al.

[11] Patent Number: 5,153,449
[45] Date of Patent: Oct. 6, 1992

[54] HEATSINK BUS FOR ELECTRONIC SWITCH

[75] Inventors: Fred Crook, Waukesha; Michael R. West, Hartland; Gino P. Domenella, Brookfield; Kevin Glasgow, North Fond du Lac, all of Wis.

[73] Assignee: Milwaukee Electric Tool Corporation, Brookfield, Wis.

[21] Appl. No.: 574,296

[22] Filed: Aug. 28, 1990

[51] Int. Cl.⁵ .............................................. H05K 7/20
[52] U.S. Cl. ...................................... 307/66; 29/854; 174/16.2; 361/388; 429/9; 429/120
[58] Field of Search .................... 361/407, 386–389; 174/16.2, 16.3; 357/81; 165/80.3; 307/10.1, 43, 44, 48, 66, 112, 113, 115; 429/120, 121, 149, 150, 7, 9; 363/141, 144; 29/854; 72/260

[56] References Cited

U.S. PATENT DOCUMENTS

| | | | |
|---|---|---|---|
| 3,029,301 | 4/1962 | Strider | 136/181 |
| 4,047,242 | 9/1977 | Jackob et al. | 361/389 |
| 4,314,270 | 2/1982 | Iwatani | 357/75 |
| 4,360,766 | 11/1982 | Bogardus, Jr. | 318/139 |
| 4,458,305 | 7/1984 | Buckle et al. | 363/141 |
| 4,700,273 | 10/1987 | Kaufman | 361/388 |
| 4,879,630 | 11/1989 | Boucard et al. | 361/386 |
| 4,901,201 | 2/1990 | Crowe | 361/384 |
| 4,905,123 | 2/1990 | Windle et al. | 361/388 |

FOREIGN PATENT DOCUMENTS

| | | |
|---|---|---|
| 0330372 | 8/1989 | European Pat. Off. |
| 0365275 | 4/1990 | European Pat. Off. |
| 2903102 | 7/1980 | Fed. Rep. of Germany |
| 90/16090 | 12/1990 | World Int. Prop. O. |

OTHER PUBLICATIONS

Patent Abstracts of Japan, vol. 8, No. 261 (E-281) (1698) Nov. 30, 1984; re: 59-132178 (Jul. 30, 1984).
Electrotechnik, vol. 71, No. 8, Nov. 1989, pp. 16–18, 21.
I.B.M. Technical Disclosure Bulletin, vol. 19, No. 9, Feb. 1977, pp. 3346–3347.

*Primary Examiner*—A. D. Pellinen
*Assistant Examiner*—David Osborn
*Attorney, Agent, or Firm*—Michael, Best & Friedrich

[57] ABSTRACT

An electronic circuit device includes a metallic member composed of a thermally and electrically conductive material and comprising a unitary mass defining a heatsink and being free of mechanical or electrical transition joints. Electronic switching devices are mounted on the member and in electrical and thermal contact therewith. A control circuit and a conductor are each mounted on the member and adjacent the switching circuit devices and electrical conductors interconnect the switching circuit devices with the control circuit. The control circuit and the conductor are thermally and electrically isolated from the metallic member. The metallic member comprises a heatsink for the electronic switching devices and a conductor for currents being switched thereby.

21 Claims, 1 Drawing Sheet

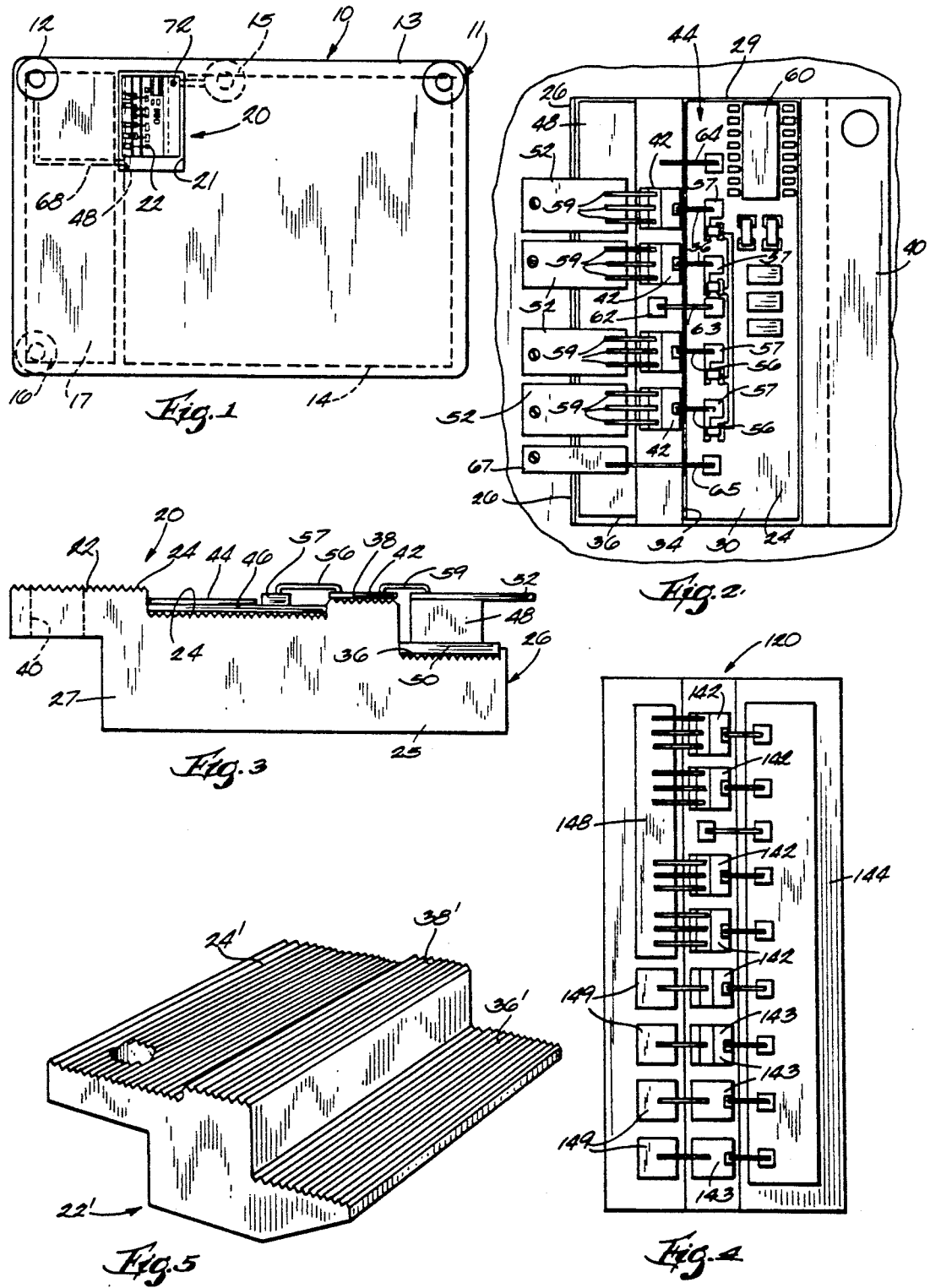

HEATSINK BUS FOR ELECTRONIC SWITCH

BACKGROUND OF THE INVENTION

This invention relates to electronic circuits and more particularly to electronic power switching circuits which include a heatsink.

Power hybrid circuits commonly include silicon power switching devices, such as MOSFETs, mounted on electrically insulating ceramic members disposed on a metallic heatsink, such as copper. The sandwich of silicon, ceramic and copper are joined into a sandwich by soldering, after which the electrical connections are made in any suitable manner, such as by wire bonding, which comprises ultrasonically welding aluminum wire to the silicon device and to a current-carrying electrode, for example. The joining of heat spreaders, ceramic insulators and silicon devices place the various electric terminals at different elevations, thereby requiring relatively long wire bonds which adversely affects performance and reliability. To avoid these adverse effects, prior art heatsinks were fabricated by soldering or braising various sized blocks and plates to a base member to achieve uniform wire bond lengths, to vary the mass of the article and to support the required silicon devices.

One application for power hybrid circuits of the type described is in a dual storage battery for automotive and similar uses. Such batteries include a primary cell unit which is used for normal operation and an auxiliary or reserve cell unit which is normally on standby. Should the primary unit become discharged, the auxiliary unit is switched into the vehicle's electrical circuity. This permits the vehicle to be started so that the primary unit can be recharged, after which the primary unit is switched into the circuit and the auxiliary unit returned to its reserve status. This application requires that the electronics switching devices carry momentarily high currents, such as, for example, in the order of several hundred amps or more. As a result, a substantial heatsink is required.

SUMMARY OF THE INVENTION

It is an object of the invention to provide a new and improved heatsink and conductor for electronic circuit components.

A further object of the invention is to provide a heatsink and conductor for electronic circuit components which is easy to manufacture and assemble to the apparatus to which it is to be applied.

Another object of the invention is to provide a heatsink and conductor for electronic circuit components which permits the use of relatively short wire bonds.

A still further object of the invention is to provide a method of manufacturing heatsinks for electronic circuit components in which adjustment of thermal mass, the arrangement and mounting of silicon devices and thermal and electrical isolation is facilitated.

Yet another object of the invention is to provide a heatsink and electrical conductor for electronic circuit components which comprises a unitary mass free of mechanical or electrical transitions or joints.

These and other objects and advantages of the present invention will become more apparent from the detailed description thereof taken with the accompanying drawings.

In general terms, the invention comprises the combination of a metallic member composed of a thermally and electrically conductive material and comprising a unitary mass defining a heatsink and being free of mechanical or electrical transition joints. At least one electronic switching means is mounted on the member and in electrical and thermal contact therewith and control means and electrical conductor means are each mounted on the member and adjacent the switching means. Electrical conductor means interconnects the switching means with the control circuit means and the conductor means wherein the metallic member acts as a heatsink for the electronic switching means and has a conductor for the current being switched thereby.

According to a further of its aspects, the invention comprises the combination of a storage battery having primary and auxiliary cells, first and second terminal means in circuit with the primary cells and third and fourth terminal means in circuit with the auxiliary cells and switching means in circuit between the second and third terminals and operative to place the primary and auxiliary cells in a parallel circuit relation. The switching means includes a metallic member composed of a thermally and electrically conductive material and comprising a unitary mass defining a heatsink and being free of mechanical and electrical transition joints. At least one electronic switch means is mounted on the member in electrical and thermal contact therewith and control circuit means and conductor means are mounted on the member and adjacent the electronic switching means. Electrical conductor means interconnects the electronic switching means with the control circuit and the conductor means wherein the member acts as a heatsink for the electronic switching means and as a conductor for the current being switched thereby.

According to another of its aspects, the invention comprises the combination of a metallic member composed of a thermally and electrically conductive material and comprising a unitary mass defining a heatsink and being free of mechanical and electrical joints and first electronic circuit means mounted on the member and in electrical and thermal contact therewith. Second electronic circuit means is mounted on the member and adjacent the first electronic circuit means. First terminal means is connected in circuit with the member and is constructed and arranged to be connected to a source of electrical energy and the second terminal means is insulated from the member and is constructed and arranged to be connected to a controlled device. Electrical conductor means interconnect the first electronic circuit means with the second electronic circuit means and the first terminal means, the metallic member acting as a heatsink for the first electronic circuit means and as a conductor for the current being controlled thereby.

According to a still further aspect, the invention comprises a method of manufacturing an electrical circuit assembly comprising the steps of extruding an elongate shaped member formed of a metallic material having high thermal and electrical conductivity, severing a first predetermined length of the extruded member to provide a unitary member which defines a conductor and heatsink and is free of mechanical and electrical transition joints, mounting electrical circuit means in thermal and electrical contact with a surface of the member, mounting control circuit means and conductor means on the member and adjacent the electronic switching means, and electrically interconnecting the electronic switching means with the control circuit means and the conductor means and electrically insulating the control circuit means and the conductor means from the member.

BRIEF DESCRIPTION OF THE DRAWINGS

FIG. 1 is a top plan view of an automotive battery with which the electronic circuit device according to the invention may be employed;

FIG. 2 is a top plan view of the electronic circuit device according to the preferred embodiment of the invention;

FIG. 3 is a side elevational view of the electronic circuit device shown in FIG. 2;

FIG. 4 is a perspective view of an alternate embodiment of the invention; and

FIG. 5 is a top view of an alternate embodiment of the invention.

DETAILED DESCRIPTION OF THE PREFERRED EMBODIMENT

FIG. 1 shows a lead acid storage battery 10 for any well-known purpose, such as, for example, automotive or marine use. Battery 10 has a first pair of terminals 11 and 12 mounted on the outer battery casing 13 and in circuit with the primary battery cells 14 (not shown) and a second pair of terminals 15 and 16 mounted within the casing 13 and in circuit with the auxiliary battery cells 17 (not shown).

As those skilled in the art will appreciate, the primary battery cells 14 are normally in circuit with the apparatus being powered. Should the primary cells 14 become discharged, the auxiliary cells 17 are switched into the circuit for emergency power requirements. The electronic circuit devices for performing this switching operation and other control functions are mounted on a body 20 in accordance with the preferred embodiment of the invention which acts as a conductor and heatsink. The body 20 is suitably mounted in a suitable recess 21 formed in casing 13.

It will be appreciated by those skilled in the art that the specific configuration of the member 20 will be dictated by its application, its electrical and thermal requirements, the configuration of the apparatus on which it is mounted, and the number, arrangement and type of electrical devices which it supports. Accordingly, the specific shape of the member 20 is only one example of the invention, it being understood that the invention encompasses other shapes as well.

The heatsink and conductor 20 of the illustrated example is shown in FIGS. 2 and 3 to comprise a shaped body formed of a conductive material, such as copper. Preferably, the body 20 is a unitary member formed in any suitable manner. In the preferred embodiment of the invention, the body 20 is formed by extruding an elongate copper member through an appropriately shaped die. The body 20 is then cut from the extruded member to a length which depends upon parameters such as current flow, ambient temperature, power dissipation, duty cycle and the like. In addition, the shape of the body 20 must be such as to accommodate the electrical devices being supported and cooled. It can be seen that by fabricating body 20 by an extrusion process, heatsinks having different thermal requirements can be fabricated from a single extrusion. For example, merely by cutting the member to a greater or lesser length will control the amount of heat which can safely be dissipated. In addition, by employing extrusions, the intricately shaped members can be economically formed without mechanical or electrical transition joints. In addition, it is possible to form longitudinal grooves 23 in the surface of member 22 which facilitates soldering.

In the illustrated example, the member 20 has upper and lower surfaces 24 and 25, sides 26 and 27 and ends 29 and 30. A longitudinal channel 34 is formed in the upper surface 24 and intermediate the sides 26 and 27. At the side 26, there is an area of reduced thickness which defines a step 36 which is below the level of the channel 36. Between the step 36 and the channel 34 there is an elongate strip 38. At the opposite side 27 of the member 22, there is a recess 40 formed in the lower surface to facilitate mounting on the electrical device with which the member 20 is to be used, and which in the illustrated example, is the lead acid storage battery 10. The member 20 may be nickel-plated to facilitate soldering and wire bonding, thereby aiding in the manufacturing process.

The illustrated embodiment shown in FIGS. 2 and 3 include various circuit components mounted on the member 20. It will be appreciated that the particular circuit components and their arrangement on member 20 are for purposes of illustration only, and that an infinite arrangement of such parts is possible. Also, as indicated above, the specific configuration of member 20 is dictated not only by its application, but also by the circuitry which it supports. Therefore, it should be understood that the invention is not limited to the specifically illustrated embodiment, but only by the scope of the appended claims. With the foregoing in mind, the specific circuit configuration shown in the drawings will now be discussed.

In the example illustrated in FIGS. 2 and 3, a plurality of power MOSFETs 42 are mounted on and are in direct thermal contact with the strip portion 38 of body 20. Control circuitry 44 for the MOSFETs 42 is formed on a substrate applied to a ceramic strip 46 mounted on the groove 24. The ceramic strip 46 provides support for and electrically insulates the control circuit 44 from the electrically conductive body 20. A bus bar 48 extends for substantially the length of the step 38 and is mounted on a second electrically insulating ceramic strip 50 supported by step 38. In addition, there is a terminal 52 mounted on the bus bar 48 and opposite each MOSFET 42 and a further terminal 54 is formed on the bus bar and is adapted to be coupled to the control circuit 44.

Wire bonds 56 connect the gate of each MOSFET 42 to a different one of the wire pads 57 which form a part of the control circuit 44. In addition, groups of wire bonds 59 couple the source of each MOSFET to an adjacent terminal 52. It is an important feature of the invention that the elevation and the location of the surfaces defined by the groove 24, the step 36 and the strip 38 are such that the terminations of the wire bonds are all at the same height and relatively close so that the wire bonds can be relatively short. Since the control circuit 44 and ceramic strip 46, the MOSFET 42 and the conductor 48 and ceramic strip 50 have different relative thicknesses, the surfaces defined by groove 24, strip 38 and step 36 are all at different relative heights on member 20 whereby the elevation of the respective terminals are at about the same elevation.

The drain of each MOSFET 42 is in electrical contact with the body 20, which carries the relatively large currents being switched. In addition, each MOSFET 42 is in thermal contact with the body 20 for absorption and dissipation of heat generated during the switching and current-carrying operations.

Other circuit components shown in FIGS. 2 and 3 includes an integrated circuit 60 which provides MOSFET gate signals upon the receipt of command signals from an outside source (not shown) and a thermal sensor 62 coupled by wire bond 63 to the control circuit 44. In addition wire bonds 64 and 65 may also be provided for connecting the control circuit 44 to the body 20 and to a terminal 67 mounted on bus bar 48.

Referring again to FIG. 1, it can be seen that one of the battery terminals is connected to the bus bar 48 by conductor 68 and that the corresponding terminal of the auxiliary cells is connected by conductor 70 to terminal 72 on the body 20. In the illustrated embodiment, the switching device is between the negative battery terminals 12 and 15, respectively, although switching could also be affected between the positive terminals 11 and 16, as well, in which event the negative terminals would be directly connected. When the battery 10 is in normal operation, the MOSFETs 42 are off and the negative auxiliary terminal 15 is disconnected from the negative battery terminal 12. As a result, the auxiliary cells 17 are disconnected from the vehicle's electrical system even though the positive primary battery terminal 11 is connected to the positive auxiliary battery terminal 16. When the MOSFETs 42 receive a gate signal and thereby become conductive, terminal 15 is connected to terminal 12 thereby placing the auxiliary battery cells 17 in parallel with the primary battery cells 14. Those skilled in the art will appreciate that the terminals 15 and 16 and the conductors 68 and 70 are located within the battery casing 13.

FIG. 4 shows a variation of the member 20' and includes a groove 24' for receiving the control circuit, a step 36' for receiving a bus bar and the strip 38' for receiving the MOSFETs. Other variations are also possible without deviating from the spirit of the invention.

It can be seen that because the member 20 is formed from an extrusion and not from individual components which are joined by braising or soldering, the method of manufacture according to the invention is not only less costly but also eliminates interfaces of relatively higher thermal and electrical resistance which reduce the effectiveness of the body as a conductor and heatsink.

FIG. 5 shows a further embodiment of the invention to include not only the switching circuit devices such as MOSFETs 142 for performing the battery switching operation discussed above, but also, there are a plurality of additional MOSFETs 143. The MOSFETs 142 are connected to the control circuit 144 and to the bus bar 148. The additional MOSFETs 143 are connected to the control circuit 144 and to terminal pads 149 which, in turn, are connected to other electrical devices being controlled. For example, if the invention is employed in an automotive application, the terminal pads 149 may be connected to circuits controlling lighting, windshield wipers, door locks, window controls, etc. In this example, each of the terminal pads 149 are electrically isolated one from the other and from the member 122, while all of the switching circuit devices 142 are connected to bus bar 148. FIG. 6 illustrates that merely by increasing the length of the heatsink and conductor member 120, additional circuit elements can be accommodated.

We claim:

1. In combination, a metallic member composed of a thermally and electrically conductive material, said member comprising a unitary mass defining a heatsink and being free of mechanical or electrical transition joints,
   at least one switching means mounted on said member and in electrical and thermal contact therewith, control circuit means and electrical conductor means each mounted on said member and adjacent said switching means,
   said electrical conductor means connecting said switching means to said control circuit means, said metallic member acting as a heatsink for the switching means and as a conductor for current being switched thereby.

2. The combination set forth in claim 1 wherein said member has a support surface formed thereon,
   said switching means, said control circuit means and said electrical conductor means being mounted on said support surface,
   first and second conductive means, respectively, connecting said switching means to said control circuit and to said conductor means and each having terminations on opposite ends thereof,
   said support surface, said switching means, said control circuit means and said electrical conductor means all being configured such that all of said terminations are at the same relative elevation.

3. The combination set forth in claim 2 wherein there are a plurality of switching means, a first plurality of conductive means connecting each of said switching means to said control circuit means and a second plurality of conductive means connecting said switching means in a parallel circuit relation to said electrical conductor means.

4. The combination set forth in claim 2 wherein there is a first electrical and heat barrier means between said member and said control circuit means and a second thermal and electrical barrier means between said conductor means and said member.

5. The combination set forth in claim 4 wherein said support surface includes first, second and third support surfaces, each located at a different relative elevation,
   said control circuit mean being mounted on said first support surface,
   said switching means being mounted on said second support surface and said conductor means being mounted on said third surface,
   the thickness of said control circuit means, said switching circuit means and said conductor means and the relative elevations of said first, second and third support surfaces being such that the terminations of said conductor means are at the same elevation.

6. The combination of a storage battery having primary cells and auxiliary cells,
   first and second terminal means in circuit with the primary cells, and third and fourth terminal means in circuit with the auxiliary cells,
   and at least one switching means in circuit between said second and third terminal means and operative to place said primary and auxiliary cells in a parallel circuit relation,
   said switching means including a metallic member composed of a thermally and electrically conductive material,
   said member comprising a unitary mass defining a heatsink and being free of mechanical or electrical transition joints, at least one of said switching means mounted on said member in electrical and thermal contact therewith, control circuit means and conductor means mounted on said member and adjacent said switching means, and electrical conductor means connecting said switching means to said control circuit, said member acting as a heatsink for said switching means and as a conductor for current being switched thereby.

7. The combination set forth in claim 6 wherein said member has a support surface formed thereon, said switching means, said control circuit means and said electrical conductor means being mounted on said support surface, first and second conductive means, respectively, connecting said switching means to said control circuit and to said conductor means and each having terminations on opposite ends thereof, said support surface, said switching means, said control circuit means and said electrical conductive means all being configured such that all of said terminations are at the same relative elevation.

8. The combination set forth in claim 6 wherein there are a plurality of switching means, a first plurality of conductive means connecting each of said switching means to said control circuit means and a second plurality of conductive means connecting said electronic switching means to said electrical conductor means.

9. The combination set forth in claim 7 wherein there is a first electrical and heat barrier means between said member and said control circuit means and a second thermal and electrical barrier means between said conductor means and said member.

10. The combination set forth in claim 9 wherein said support surface includes first, second and third support surfaces each located at a different relative elevation, said control circuit mean being mounted on said first support surface, said switching means being mounted on said second support surface and said conductor means being mounted on said third surface, the thickness of said control circuit means, said switching circuit means and said conductor circuit means and the relative elevations of said first, second and third support surfaces being such that the terminations of said conductive means are at the same elevation.

11. In combination, a metallic member composed of a thermally and electrically conductive material, said member comprising a unitary mass defining a heatsink and being free of mechanical or electrical transition joints, first electronic circuit means mounted on said member and in electrical and thermal contact therewith, second electronic circuit means mounted on said member and adjacent said first electronic circuit means, first and second terminal means mounted on said member, said first terminal means being connected in circuit with said member and constructed and arranged to be connected to a source of electrical energy and said second terminal means being insulated from said member and constructed and arranged to be connected to a controlled device, and electrical conductor means connecting said first and second electronic circuit means to each other and said first electronic circuit means to said first terminal means, said metallic member acting as a heatsink for the first electronic circuit means and as a conductor for current being controlled thereby.

12. The combination set forth in claim 11 wherein said member has a surface formed thereon, said first and second electronic circuit means and said first terminal means being mounted on said first surface, first and second conductive means, respectively, connecting said first and second electronic circuit means to each other and said first circuit means to said second terminal means, each conductive means having terminations on opposite ends thereof, said surface, said first and second electronic circuit means and said second terminal means all being configured such that all of said terminations are at the same relative elevation.

13. The combination set forth in claim 12 wherein there are a plurality of first electronic circuit means, a first plurality of conductive means connecting each of said first circuit means to said second electronic circuit means and a second plurality of said conductive means connecting each of said first circuit means to said second terminal means.

14. The combination set forth in claim 12 wherein there is a first electrical and heat barrier means between said member and said second electronic circuit means and a second thermal and electrical barrier means between said second terminal means and said member.

15. The combination set forth in claim 14 wherein said first surface includes first, second and third support surfaces, each located at a different relative elevation, said first electronic circuit means being mounted on said first support surface, said second electronic circuit means being mounted on said second support surface and said second terminal means being mounted on said third surface, the thickness of said first electronic circuit means, said second electronic circuit means and said second terminal means and the relative elevations of said first, second and third support surfaces being such that the terminations of said conductor means are at the same elevation.

16. A method of manufacturing an electrical circuit assembly comprising the steps of:

extruding an elongate shaped member formed of a metallic material having high thermal and electrical conductivity, severing a first predetermined length of said extruded member to provide a unitary member which defines a conductor and heatsink and is free of mechanical and electrical transition joints, mounting electronic circuit means in thermal and electrical contact with a surface of said unitary member, such that the unitary member provides current to the electronic circuit means mounting control circuit means and conductor means on said unitary member and adjacent said electronic circuit means, and electrically connecting said electronic circuit means to said control circuit means with said conductor means and electrically insulating said control circuit means and said conductor means from said member.

17. The method set forth in claim 16 and including the step of providing first and second thermal and electrical barrier means, respectively, between said member and said control circuit means and said conductor means.

18. The method set forth in claim 17 and including the steps of providing a plurality of electrical switching devices and a first plurality of said conductor means, connecting said first and second electric switching devices to said control circuit means with said first plurality of said conductors and a second plurality of said conductor means and connecting said switching circuit devices to said first and second conductor means.

19. The method set forth in claim 18 including the steps of providing a first electrical and heat barrier means between said member and said control circuit means and a second thermal and electrical barrier means between said conductive means and said member.

20. The method set forth in claim 19 and including the steps of forming first, second and third support surfaces on one face of same member and locating each at a different relative elevation, mounting said control circuit means on said first support surface, mounting said electronic switching means on said second support surface and mounting said conductor means on said third surface, the thickness of said control circuit means, said electronic switching means and said conductor circuit means and the relative elevations of said first, second and third support surfaces being such that the terminations of said conductor means are at the same elevation.

21. A method of manufacturing an electrical circuit assembly comprising the steps of:

forming an elongate shaped member comprising a metallic material having high thermal and electrical conductivity, severing a first predetermined length of said member to provide a unitary member which defines a conductor and heatsink and is free of mechanical and electrical transition joints, mounting electronic circuit means in thermal and electrical contact with a surface of said unitary member such that the unitary member provides current to the electronic circuit means, mounting control circuit means and conductor means on said unitary member and adjacent said electronic circuit means, and electrically connecting said electronic circuit means to said control circuit means with said conductor means and electrically insulating said control circuit means and said conductor means from said member.

* * * * *